US012593580B2

(12) United States Patent
Park

(10) Patent No.: US 12,593,580 B2
(45) Date of Patent: Mar. 31, 2026

(54) DISPLAY DEVICE INCLUDING INCLINED LIGHT EMITTING PORTIONS

(71) Applicant: LG Display Co., Ltd., Seoul (KR)

(72) Inventor: Kyoungjin Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 494 days.

(21) Appl. No.: 18/089,437

(22) Filed: Dec. 27, 2022

(65) Prior Publication Data

US 2023/0209938 A1 Jun. 29, 2023

(30) Foreign Application Priority Data

Dec. 27, 2021 (KR) ........................ 10-2021-0188022

(51) Int. Cl.
| *H10K 59/131* | (2023.01) |
| *H10K 50/824* | (2023.01) |
| *H10K 59/122* | (2023.01) |
| *H10K 71/60* | (2023.01) |

(52) U.S. Cl.
CPC ......... *H10K 59/131* (2023.02); *H10K 50/824* (2023.02); *H10K 59/122* (2023.02); *H10K 71/611* (2023.02)

(58) Field of Classification Search
CPC .. H10K 59/131; H10K 50/824; H10K 59/122; H10K 71/611; H10K 59/353; H10K 71/236; H10K 59/88; H10K 71/12
See application file for complete search history.

(56) References Cited

U.S. PATENT DOCUMENTS

| | | | |
|---|---|---|---|
| 9,818,941 B2 | 11/2017 | Min | |
| 10,134,819 B2 | 11/2018 | Mori et al. | |
| 10,553,805 B2 | 2/2020 | Maeda et al. | |
| 11,462,687 B2 | 10/2022 | Zhao et al. | |
| 2008/0290794 A1 | 11/2008 | Yuasa | |
| 2013/0057456 A1* | 3/2013 | Omoto ................. | H10K 59/353 |
| | | | 313/504 |
| 2013/0099218 A1* | 4/2013 | Lee ........................ | H10K 50/11 |
| | | | 438/22 |
| 2016/0181335 A1* | 6/2016 | Mori .................... | H10K 71/191 |
| | | | 257/40 |
| 2016/0351632 A1* | 12/2016 | Iguchi ................. | H10K 59/122 |
| 2016/0372670 A1 | 12/2016 | Min | |
| 2017/0053591 A1* | 2/2017 | Seo ....................... | G09G 3/3225 |

(Continued)

FOREIGN PATENT DOCUMENTS

| | | |
|---|---|---|
| CN | 109920940 A | 6/2019 |
| JP | 2008-277264 A | 11/2008 |

(Continued)

*Primary Examiner* — Jacob Y Choi
*Assistant Examiner* — Grace Cha
(74) *Attorney, Agent, or Firm* — Seed Intellectual Property Law Group LLP

(57) ABSTRACT

Disclosed is a display device comprising: a substrate comprising a display area in which pixel areas are disposed and a non-display area adjacent to the display area; light emitting portions disposed in the display area and comprising at least one of the pixel areas; the light emitting portions emitting light through the pixel areas; connecting portions connecting the light emitting portions; a bank defining the light emitting portions and the connecting portions; and a light emitting layer formed on the light emitting portions and the connecting portions.

21 Claims, 8 Drawing Sheets

(56) References Cited

U.S. PATENT DOCUMENTS

| | | | | |
|---|---|---|---|---|
| 2018/0358573 A1* | 12/2018 | Maeda | ................. | H10K 59/122 |
| 2019/0207150 A1* | 7/2019 | Kwon | .................. | H10K 59/123 |
| 2021/0175459 A1* | 6/2021 | Lee | ........................ | H10K 59/88 |

FOREIGN PATENT DOCUMENTS

| | | | |
|---|---|---|---|
| JP | 2010170767 A | 8/2010 |
| JP | 2013-058324 A | 3/2013 |
| JP | 2018-206710 A | 12/2018 |
| JP | 2019-194960 A | 11/2019 |
| KR | 20130027428 A | 3/2013 |
| KR | 20160024385 A | 3/2016 |
| KR | 20160067544 A | 6/2016 |
| KR | 20160148791 A | 12/2016 |
| KR | 20170023361 A | 3/2017 |
| WO | 2015/041040 A1 | 3/2015 |

* cited by examiner

DISPLAY DEVICE INCLUDING INCLINED LIGHT EMITTING PORTIONS

CROSS-REFERENCE TO RELATED APPLICATION

This application claims the benefit of and priority to Korean Patent Application No. 10-2021-0188022, filed on Dec. 27, 2021, which is herein incorporated by reference in its entirety.

BACKGROUND

Technical Field

The present disclosure relates to a display device.

Description of the Related Art

As the information society evolves, various types of display devices have been developed. Recently, display devices such as a liquid crystal display (LCD), a plasma display panel (PDP), and an organic light emitting display (OLED) have been utilized.

An organic light emitting diode constituting the organic light emitting display is a self-luminous type and does not require a separate light source so that the thickness and weight of a display device can be reduced. In addition, the organic light emitting display exhibits high quality characteristics such as low power consumption, high luminance, and high response speed, etc.

Recently, a technique for forming a light emitting layer of the organic light emitting diode through a solution process using an inkjet device or the like has been developed. The solution process is performed in a way of applying a solution for forming a light emitting layer to a preset area and then dry the solution.

BRIEF SUMMARY

Embodiments of the present disclosure provide a display device that can improve spread of the light emitting layer of the organic light emitting diode manufactured using the solution process, thereby reducing a thickness variation and improving the flatness thereof.

Also, the display device according to embodiments of the present disclosure may prevent dewetting in a peripheral dummy area, thereby defects can be reduced or prevented. A display device according to an embodiment may include a substrate including a display area in which pixel areas are disposed and a non-display area adjacent to the display area, light emitting portions disposed in the display area and including at least one of the pixel areas, the light emitting portions emitting light through the pixel areas, connecting portions connecting the light emitting portions, a bank defining the light emitting portions and the connecting portions, and a light emitting layer formed on the light emitting portions and the connecting portions.

The light emitting portions may have a quadrangular shape inclined to a left or right side with respect to a column direction, and the connecting portions may extend substantially in a row direction between rows of two adjacent light emitting portions.

Same-colored light emitting portions may be disposed along the column direction, and the connecting portions may connect the same-colored light emitting portions disposed adjacently in the row direction.

One connecting portion and light emitting portions connected to the one connecting portion may form a fishbone shape.

Connecting portions connected to respective different-colored light emitting portions may be disposed alternately along the column direction.

The display device may further include a power line configured to apply a low potential voltage to the pixel areas, wherein the power line may include first patterns extending along the column direction while overlapping the light emitting portions disposed along the column direction and second patterns disposed overlapping the connecting portions.

The display device may further include light emitting elements disposed in each of the pixel areas and connected to the power line through a contact hole formed in an auxiliary electrode contact portion, wherein the auxiliary electrode contact portion may be disposed at an intersection of the first patterns and the second patterns of the power line.

The display device may further include a first dummy connecting portion extending in the non-display area along the column direction and connecting same-colored connecting portions, and a second dummy connecting portion extending in the non-display area along the row direction and connecting same-colored light emitting portions disposed at an edge of the display area.

The first dummy connecting portion and the second dummy connecting portion may be connected to each other at one end.

The light emitting portion may be formed to extend from the connecting portion to the first dummy connecting portion and the second dummy connecting portion.

The bank may include a first bank defining the pixel areas and having a hydrophilic property, and a second bank of a hydrophobic property disposed on the first bank and defining the light emitting portions and the connecting portions.

A display device according to an embodiment may include a substrate including a display area in which pixel areas are disposed and a non-display area adjacent to the display area, a bank defining light emitting diode areas of the pixel areas, and a light emitting diode formed in the light emitting diode area.

The bank may include a first bank provided with first openings exposing a central portion of an anode electrode of the light emitting diode, and a second bank formed on the first bank and provided with second openings exposing a light emitting portion comprised of at least one of the pixel areas. The bank also has third openings connecting the light emitting portions.

The second openings may have a quadrangular shape inclined to a left or right side with respect to a column direction, and the third openings may extend substantially in a row direction between the second openings adjacent to each other in a column direction.

The second openings may expose same-colored light emitting portions disposed along the column direction, and the third openings may connect second openings disposed adjacently in the row direction and corresponding to the same-colored light emitting portions.

One third opening and second openings connected to the one third opening may form one fishbone shape.

The display device may further include a power line configured to apply a low potential voltage to the pixel areas, wherein the power line may include first patterns extending along the column direction while overlapping the second openings disposed along the column direction and second patterns disposed overlapping the third openings.

A cathode electrode of the light emitting diode may be connected to the power line through a contact hole formed in an auxiliary electrode contact portion, wherein the auxiliary electrode contact portion may be disposed at an intersection of the first patterns and the second patterns of the power line.

According to one embodiment, a display device is provided with a substrate that has a display area in which a pixel area is disposed and a non-display area adjacent to the display area. A light emitting diode formed within the pixel area. There is a first bank with a first opening exposing a central portion of an anode electrode of the light emitting diode. There is a second bank disposed above the first bank with a second opening exposing a light emitting portion of the light emitting diode. The light emitting portion has a quadrangular shape inclined to a left or right side with respect to a column direction.

BRIEF DESCRIPTION OF THE SEVERAL VIEWS OF THE DRAWINGS

FIG. 6 is a cross-sectional view taken along a line I-I' of FIG. 5.

FIG. 8 is a cross-sectional view taken along a line II-II' of FIG. 7.

DETAILED DESCRIPTION

Figure 1:
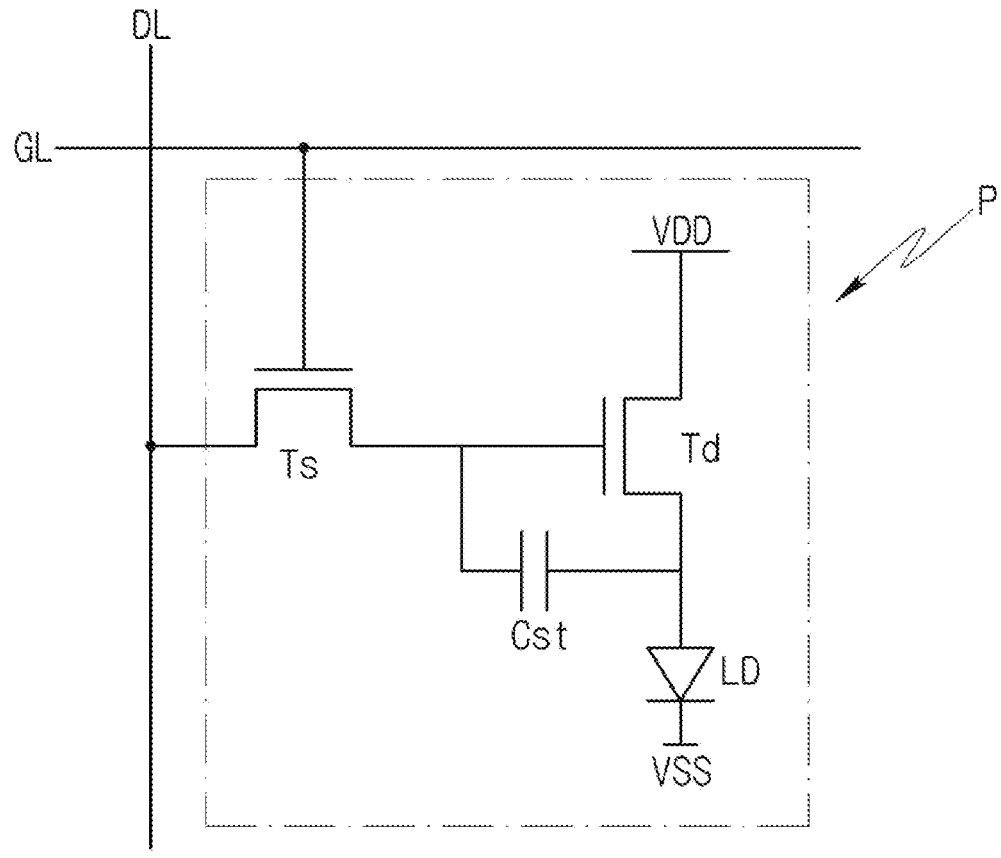
FIG. 1 is a circuit diagram illustrating a pixel area according to an embodiment of the present disclosure.

Hereinafter, embodiments will be described with reference to the accompanying drawings. When an element (or area, layer, portion, etc.) is referred to as being "on," "connected to," or "coupled to" another element, it may be directly on, connected to, or coupled to the other element or layer or intervening elements may be present therebetween.

Like reference numerals denote like elements. In the drawings, the thickness, ratio, and size of each element might not be shown to scale in some views, but might be enlarged for clarity and descriptive purposes. As used herein, the term "and/or" includes any and all combinations of one or more of the associated listed items.

Although the terms "first," "second" and the like are used for describing various elements, these elements are not confined by these terms. These terms are merely used for distinguishing one element from another element. Therefore, a first element to be mentioned below may be referred to as a second element without departing from the scope of the present disclosure, and similarly a second element may be referred to as a first element. The singular forms, "a," "an," and "the" are intended to include the plural forms as well, unless the context clearly indicates otherwise.

Terms, such as "beneath," "below," "upper," "above," and the like, may be used herein to describe one element or feature's relationship to another element(s) or feature(s) as illustrated in the drawings. The terms are spatially relative terms, and are described based on the orientation depicted in the drawings.

The terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

FIG. 1 is a circuit diagram illustrating a pixel area according to an embodiment of the present disclosure.

Referring to FIG. 1, a display device according to an example embodiment includes a gate line GL and a data line DL that cross each other and define a pixel area P. Each pixel area P is provided with a switching transistor Ts, a driving transistor Td, a storage capacitor Cst, and a light emitting diode LD.

A gate electrode of the switching transistor Ts is connected to the gate line GL, and a source electrode thereof is connected to the data line DL. A gate electrode of the driving transistor Td is connected to a drain electrode of the switching transistor Ts, and a source electrode thereof is connected to a high potential voltage VDD. An anode electrode of the light emitting diode LD is connected to a drain electrode of the driving transistor Td, and a cathode electrode thereof is connected to a low potential voltage VSS. A storage capacitor Cst is connected to the gate electrode and the drain electrode of the driving transistor Td.

The switching transistor Ts is turned on in response to a gate signal applied through the gate line GL, and a data signal applied to the data line DL is applied to the gate electrode of the driving transistor Td and to an electrode of the storage capacitor Cst through the switching transistor Ts.

The driving transistor Td is turned on in response to the data signal, and a current flowing through the light emitting diode LD is controlled, thereby displaying an image. The light emitting diode LD emits light by the current of the high potential voltage VDD transmitted through the driving transistor Td.

The amount of the current flowing through the light emitting diode LD is proportional to the magnitude of the data signal, and the intensity of light emitted by the light emitting diode LD is proportional to the amount of the current flowing through the light emitting diode LD. Thus, the pixel area P show different gray levels depending on the magnitude of the data signal, and as a result, an electroluminescent display device displays an image.

The storage capacitor Cst maintains charges corresponding to the data signal for one frame, and therefore allows the amount of the current flowing through the light emitting diode LD to be constant and the gray level shown by the light emitting diode LD to be kept constant.

Figure 2:
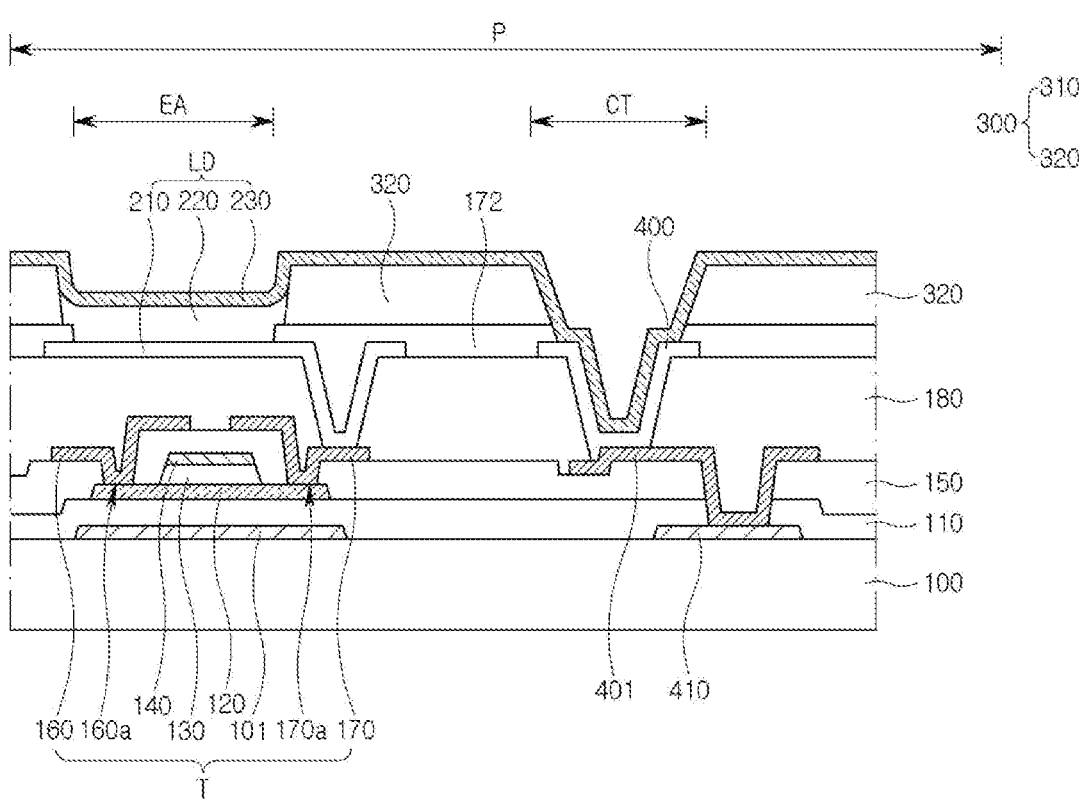
FIG. 2 is a cross-sectional view schematically illustrating the pixel area according to an embodiment of the present disclosure.

FIG. 2 is a cross-sectional view schematically illustrating a pixel area according to an embodiment of the present disclosure.

Referring to FIG. 2, the pixel area P includes a substrate 100, a circuit element layer disposed on the substrate 100 and having circuit elements disposed thereon, and a light emitting diode layer disposed on the circuit element layer and having light emitting elements LD of the pixel area P disposed thereon.

The substrate 100 may be a base substrate and a light-transmissive substrate. The substrate 100 may be a rigid substrate including glass or tempered glass or a flexible substrate made of a plastic material.

A light shielding layer 101 may be formed on the substrate 100. The light shielding layer 101 may be disposed overlapping a gate electrode 140 of a transistor T, which will be described below, and therefore may block external light.

The light shielding layer 101 may be covered by a buffer layer 110. The buffer layer 110 may prevent diffusion of ions or impurities from the substrate 100 and may block moisture penetration.

An active pattern 120 may be formed on the buffer layer 110. The active pattern 120 may be made of a silicon-based semiconductor material or an oxide-based semiconductor material.

A gate insulation layer 130 may be formed on the active pattern 120, and a gate electrode 140 may be formed on the gate insulation layer 130. An inter-layer insulation layer 150 may be formed on the gate electrode 140, and a source electrode 160 and a drain electrode 170 may be formed on the inter-layer insulation layer 150. The source electrode 160 and the drain electrode 170 may be connected to the active pattern 120 through contact holes 160a and 170a penetrating the inter-layer insulation layer 150 and the gate insulation layer 130. The source electrode 160, the drain electrode 170, the gate electrode 140 and the active pattern 120 corresponding thereto may constitute the transistor T.

An overcoating layer 180 may be formed on the source electrode 160 and the drain electrode 170. The overcoating layer 180 may be a planarization film for alleviating a step difference in the lower structure.

A light emitting diode layer is formed on the overcoating layer 180 and includes light emitting elements LD. The light emitting diode LD includes an anode electrode 210, a light emitting layer 220, and a cathode electrode 230.

The anode electrode 210 is formed on the overcoating layer 180. The anode electrode 210 is connected to a drain electrode 170 of the transistor T through a via hole penetrating the overcoating layer 180.

A bank 300 is further formed on the overcoating layer 180. The bank 300 is formed to cover an edge of the anode electrode 210. An exposed area that is not covered by the bank 300 may be defined as a light emitting diode area EA of the pixel area P.

The bank 300 may be comprised of a first bank 310 having a hydrophilic property and a second bank 320 having a hydrophobic property. In an embodiment, the first bank 310 may be formed to have a wider width than the second bank 320. When a light emitting layer 220 is formed by the first bank 310 having a hydrophilic property via a solution process, which will be described below, the solution for forming the light emitting layer 220 may be spread easily.

The light emitting layer 220 is formed on the anode electrode 210. The light emitting layer 220 is formed on an exposed and not covered area of the anode electrode 210 by the bank 300. In addition, the light emitting layer 220 may be formed on the first bank 310 that is exposed without being covered by the second bank 320. That is, the light emitting layer 220 may be formed in an area surrounded by the second bank 320.

The light emitting layer 220 may be formed by a solution process using an inkjet device or the like. In particular, the light emitting layer 220 may be formed by a single solution process for the same-colored pixel areas P disposed in the same pixel column. In this embodiment, the inkjet device may apply a solution to the pixel areas P disposed in the same pixel column through a single process.

When the light emitting layer 220 is formed by the solution process, the difference in thickness may occur between a central area of the light emitting layer 220 and an edge area adjacent to the bank 300 due to tension between the solution and the bank 300. For example, the light emitting layer 220 may be formed in a concave shape in which the thickness is thinnest in its center portion and is the thickest in the area in contact with the bank 300 (pile-up). However, the present embodiment is not limited thereto. That is, in various other embodiments, structures for enhancing uniformity in thickness of the light emitting layer 220 may be disposed, and the light emitting layer 220 may have a wholly uniform thickness.

The cathode electrode 230 is widely deposited on the substrate 100. The cathode electrode 230 is formed on the light emitting layer 220 and the bank 300. That is, the cathode electrode 230 may be formed to cover the light emitting layer 220 and the bank 300.

Meanwhile, an auxiliary electrode 400 may be further formed on the light emitting diode layer. The bank 300 is further formed to cover an edge of the auxiliary electrode 400 and to expose a central portion thereof. The exposed auxiliary electrode 400 that is not covered by the bank 300 may constitute an auxiliary electrode contact portion CT. The cathode electrode 230 may contact the auxiliary electrode 400 at the auxiliary electrode contact portion CT by covering the exposed auxiliary electrode 400.

The auxiliary electrode 400 may be connected to a power line 410 through a contact hole formed in the auxiliary electrode contact portion CT. For example, the auxiliary electrode 400 may be indirectly connected to the power line 410 via a connecting electrode 401. However, the auxiliary electrode 400 may be directly connected to the power line 410 through a contact hole penetrating the overcoating layer 180, the inter-layer insulation layer 150 and the buffer layer 110. Accordingly, the cathode electrode 230 may be connected to the power line 410 through a contact hole formed in the auxiliary electrode contact portion CT.

The power line 410 may receive a low potential voltage VSS. The light emitting diode LD receives the low potential voltage VSS through the cathode electrode 230 connected to the power line 410.

Figure 3:
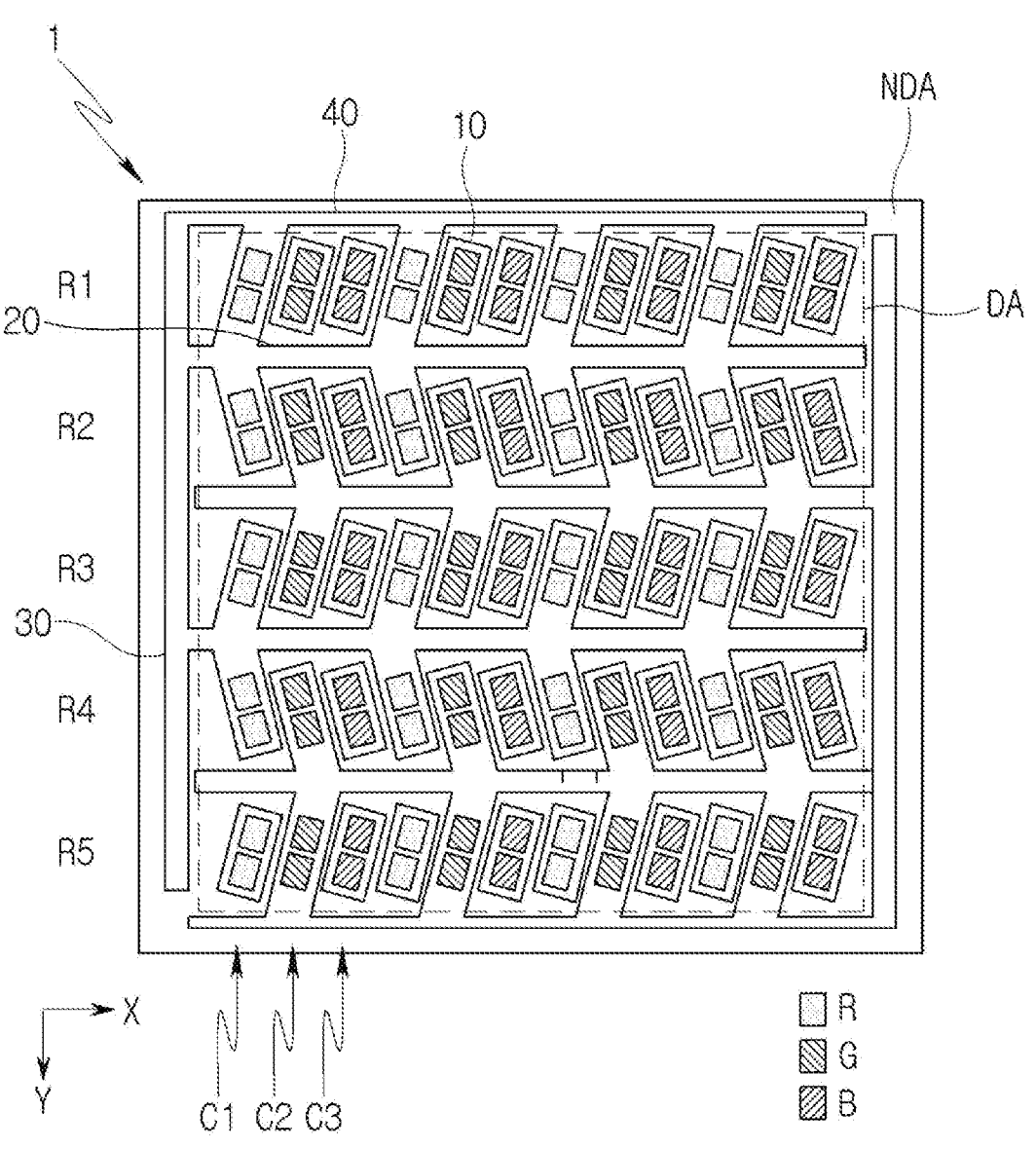
FIG. 3 is a plan view schematically illustrating a display device according to a first embodiment of the present disclosure.

FIG. 3 is a plan view schematically illustrating a display device according to a first embodiment of the present disclosure.

The display device 1 may be implemented in various forms. For example, the display device 1 may be implemented in a rectangular plate shape. However, the present embodiment is not limited thereto, and the display device 1 may have various shapes such as a square shape, a circular shape, an elliptical shape, and a polygonal shape, and a part of the corner may be formed as a curved surface or may have a shape in which the thickness is changed in at least one area. In addition, all or part of the display device 1 may have flexibility.

The display device 1 includes a display area DA and a non-display area NDA. The display area DA is an area in which the pixel areas P are disposed, and may be referred to as an active area. The non-display area NDA may be disposed around the display area DA. For example, the non-display area NDA may be disposed along the edge of the display area DA. The non-display area NDA may inclusively mean the remaining area except for the display area DA, and may be referred to as a non-active area.

Referring to FIG. 3, the display area DA may include light emitting portions 10 that emit light in any one of the first to third colors. At least one pixel area R, G, or B may be disposed in each of the light emitting portions 10. Specifically, at least one light emitting diode LD (FIG. 2) respectively provided in the at least one pixel area R, G or B may be disposed in each of the light emitting portions 10. In the illustrated embodiment, two of the pixel areas R, G, and B may be disposed in one light emitting portion 10. However, the present embodiment is not limited thereto.

The light emitting portions 10 may be disposed in a matrix form in the display area DA. For example, the light emitting portions 10 may be disposed along a row direction X and a column direction Y. In this case, same-colored light emitting portions 10 may be disposed in the column direction Y. For example, the light emitting portions 10 emitting light in red color are disposed in the first column C1, the light emitting portions 10 emitting light in green color are disposed in the second column C2, and the light emitting portions 10 emitting light in blue color may be disposed in the third column C3.

In an embodiment, the light emitting portion 10 may have a quadrangular shape (including a rectangle) inclined to a right or left side with respect to the column direction Y as illustrated, but the present embodiment is not limited thereto. In addition, although the light emitting portions 10 are illustrated in FIG. 3 as having the same shape and area, but are not limited thereto, and at least one light emitting portion 10 may have a shape and/or surface area different from that of another light emitting portion 10.

Any same-colored light emitting portions 10 disposed in two adjacent pixel rows may be connected through a connecting portion 20 substantially extending therebetween along the row direction X. The light emitting portions 10 in the inclined shape with respect to the column direction, namely, the Y direction. The angle of incline to the left or right relative to the straight column direction can be in the range of 100 to 550 degrees, with an incline in the range of 150 to 200 being preferred in one embodiment. Further, in one embodiment there is a connecting portion 20 connecting them extending in the row direction X to form one fishbone shape. That is, a fish bone shape in the display area DA includes, as illustrated, a connecting portion 20 that substantially extend along the row direction X between the pixel rows and a plurality of light emitting portions 10 that extend in a direction that is at an acute angle to the connecting portion 20. The value of the acute angle can be in the range of 80° to 35°, and in one embodiment it is in the range of 75° to 70° and in another embodiment it is in the range of 60° to 45°, with angle of approximately 45° from the connecting portion 20, being acceptable. This shape as such is defined as a fishbone shape. In this case, the angle formed by the plurality of light emitting portions 10 extending from the connecting portion 20 is not limited to 75°, 60°, or 45° but can be any acute angle.

In an embodiment, each light emitting portion has at least two light emitting diodes. In one embodiment, the light emitting portions 10 of red color of one, two or more diodes are disposed in the first row R1 and the second row R2 may be connected to each other through a first connecting portion 21 disposed therebetween. The light emitting portions 10 of green color of one, two or more diodes are disposed in the second row R2 and the third row R3 may be connected to each other through a second connecting portion 22 disposed therebetween. In addition, the light emitting portions 10 of red color disposed in the third row R3 and the fourth row R4 may be connected to each other through a third connecting portion 23 disposed therebetween, and the light emitting portions 10 of green color disposed in the fourth row R4 and the fifth row R5 may be connected to each other through a fourth connecting portion 24 disposed therebetween. Since the pixel areas R, G, and B are not disposed within the connecting portion 20, it does not emit light in a specific color.

FIG. 3 illustrates an example in that that the light emitting portions 10 of red color and the light emitting portions 10 of green color are connected to every other connecting portion 20 along the vertical direction, namely they colors alternate along the column direction Y through the connecting portion 20. However, the present embodiment is not limited thereto, and in various embodiments, the light emitting portions 10 of one or more colors can be alternately or continuously connected along the column direction Y through the respective connecting portion 20. That is, the connecting portions 20 connected to the different-colored light emitting portions 10 are disposed alternately along the column direction (Y) in one embodiment, but this is not required.

The non-display area NDA may include dummy connecting portions 30 and 40. A first dummy connecting portion 30 connects the connecting portions 20 disposed in the display area DA to each other. The connecting portions 20 connected by one first dummy connecting portion 30 may be the connecting portions 20 connected to the same-colored light emitting portions 10. The first dummy connecting portion 30 as such may extend substantially in the column direction Y from one side and/or the other side of the non-display area NDA.

A second dummy connecting portion 40 connects the same-colored light emitting portions 10 disposed at an edge of the display area DA to each other. The second dummy connecting portion 40 as such may extend substantially in the row direction X from the upper side and/or lower side of the non-display area NDA.

One of the first or second dummy connecting portions 30 or 40 may be disposed on one side of the non-display area NDA. However, the present embodiment is not limited thereto, and in other embodiments, the first or second dummy connecting portions 30 or 40 may be comprised of a plurality of sub-patterns connected to at least a portion of the light emitting portions 10 or the connecting portions 20.

The first and second dummy connecting portions 30 and 40 may be connected to each other in one edge area of the non-display area NDA. For example, the first and second dummy connecting portions 30 and 40 that are directly connected to same-colored light emitting portions 10 or indirectly through the connecting portion 20 may be connected to each other at one end.

The light emitting portion 10, the connecting portion 20, and first and second dummy connecting portions 30 and 40 may be defined by a bank 300. For example, the light emitting portion 10, the connecting portion 20, the first and second dummy connecting portions 30 and 40 may be surrounded by the second bank 320 described with reference to FIG. 2.

The light emitting layer 220 illustrated in FIG. 2 is formed in the light emitting portion 10, the connecting portion 20, and the first and second dummy connecting portions 30 and 40. When forming the light emitting layer 220, a solution is applied in the display area DA and the non-display area NDA to the light emitting portion 10, the connecting portion 20 and the dummy connecting portions 30 and 40. The light emitting layer 220 may be applied along the extending direction of the light emitting portion 10, the connecting portion 20, and the dummy connecting portions 30 and 40, corresponding thereto.

The solution dripped in the display area DA to the light emitting portion 10 and the connecting portion 20 covers the anode electrodes 210 and the first bank 310, and is not physically separated by the first bank 310.

As described above, a plurality of light emitting portions 10 are connected in a fishbone shape through a connecting portion 20. In this embodiment, a larger amount of ink may be dripped to form the light emitting layer 220 than independently dripping ink for the light emitting portions 10 separated from each other. When the amount of the applied ink is increased, the effect of the tension acting between the solution and the bank 300 during drying is reduced relative to the total surface area, so that the pile-up phenomenon is improved and the overall flatness of the light emitting layer 220 is improved, thereby the uniformity of the light emitting layer may be improved.

In addition, the solution dropped to the light emitting portions 10 and the connecting portions 20 in the display area DA is physically connected to the solution dropped to the first and second dummy connecting portions 30 and 40 in the non-display area NDA. In general, when the solution is dried, it dries faster at the outer portion, and the solution gathers toward the central portion. Then, an edge dewetting in which the amount of the solution is reduced in the edge of the display area DA and/or in the non-display area NDA may occur. This dewetting occurs relatively greater as the amount of the solution is small, and in the present embodiment, by allowing a larger amount of the solution to drip through the first and second dummy connecting portions 30 and 40, the fluidity of the solution can be increased and the edge dewetting can be reduced or prevented. As the dewetting is reduced or prevented, the flatness of the light emitting layer 220 can be improved, and accordingly the light emitting layer having the improved uniformity can be achieved. As a result, the display quality of the display device can be improved.

The dripped solution is contracted while drying, and is separated from each other between the respective pixel areas R, G, and B which are separated by the first bank 310. Accordingly, a light emitting layer 220 may be formed on the exposed anode electrode 210 that is not covered by the first bank 310 in each pixel area R/G/B.

Figure 4:
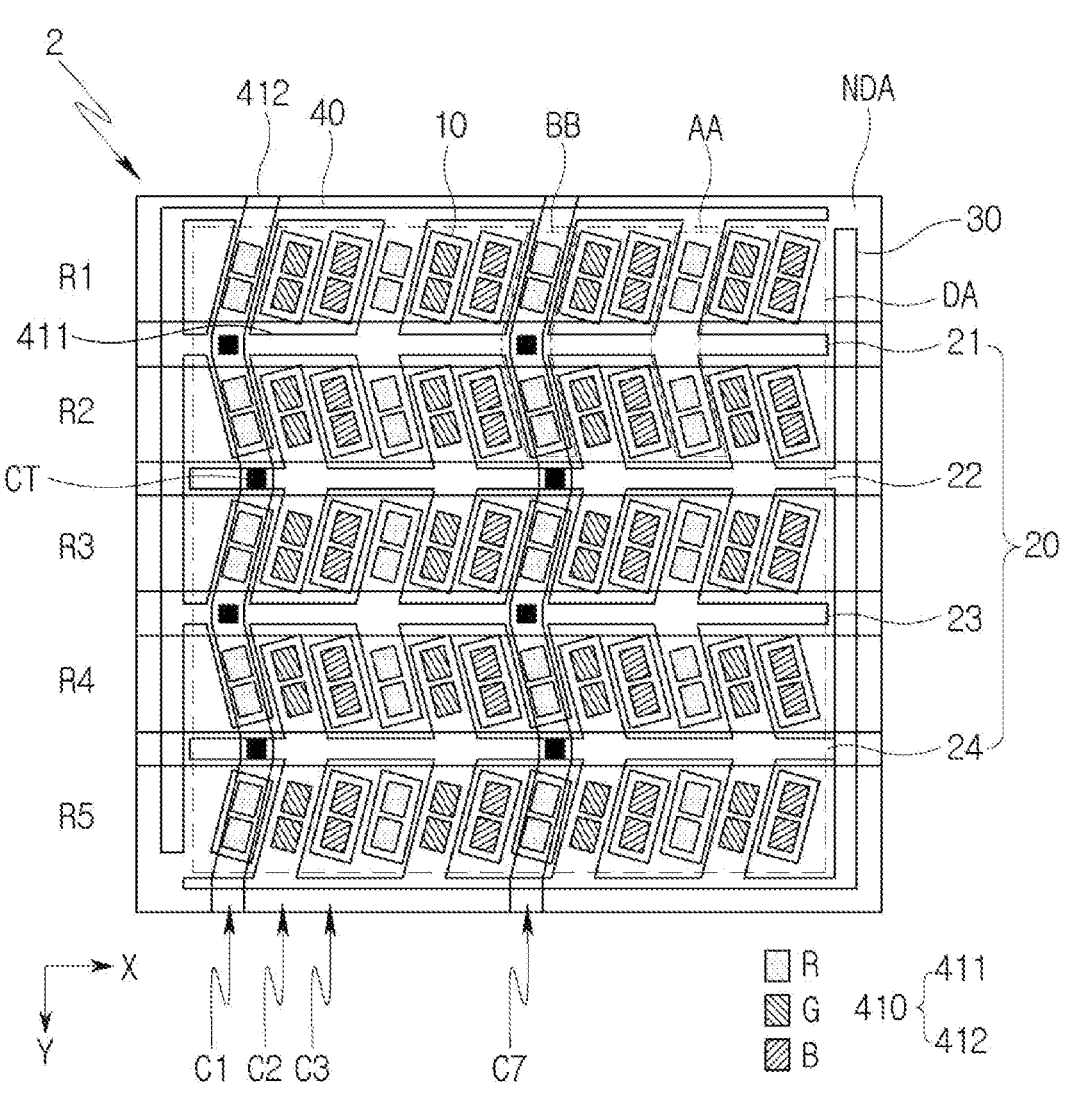
FIG. 4 is a plan view schematically illustrating an area of a display device according to a second embodiment of the present disclosure.

FIG. 4 is a plan view schematically illustrating an area of a display device according to a second embodiment of the present disclosure.

Referring to FIG. 4, a display device 2 according to the second embodiment includes a display area DA and a non-display area NDA.

The display area DA may include light emitting portions 10 that emit light in any one of the first to third colors. At least one pixel area R, G, or B may be disposed in each of the light emitting portions 10. Specifically, at least one light emitting diode LD (FIG. 2) respectively provided in the at least one pixel area R, G or B may be disposed in each of the light emitting portions 10. In the illustrated embodiment, two of the pixel areas R, G, and B are disposed in one light emitting portion 10. However, the present embodiment is not limited thereto.

The light emitting portions 10 may be disposed in a matrix form in the display area DA. For example, the light emitting portions 10 may be disposed along a row direction X and a column direction Y. Here, same-colored light emitting portions 10 may be disposed in the column direction Y. For example, the light emitting portions 10 emitting light in red color are disposed in the first column C1, the light emitting portions 10 emitting light in green color are disposed in the second column C2, and the light emitting portions 10 emitting light in blue color may be disposed in the third column C3.

In an embodiment, the light emitting portion 10 may have a quadrangular shape inclined to a right or left side with respect to the column direction Y as illustrated, but the present embodiment is not limited thereto. In addition, although the light emitting portions 10 are illustrated in FIG. 4 as having the same shape and area, but are not limited thereto, and at least one light emitting portion 10 may have a shape and/or surface area different from that of another light emitting portion 10.

Any same-colored light emitting portions 10 disposed in two adjacent pixel rows may be connected through a connecting portion 20 substantially extending therebetween along the row direction X. The light emitting portions 10 in the inclined shape with respect to the column direction Y and one connecting portion 20 connecting them while extending in the row direction X form one fishbone shape.

In an embodiment, the light emitting portions 10 of blue color disposed in the first row R1 and the second row R2 may be connected to each other through a first connecting portion 21 disposed therebetween. The light emitting portions 10 of red color disposed in the second row R2 and the third row R3 may be connected to each other through a second connecting portion 22 disposed therebetween. In addition, the light emitting portions 10 of red color disposed in the third row R3 and the fourth row R4 may be connected to each other through a third connecting portion 23 disposed therebetween. Since the connecting portion 20 does not include the pixel areas R, G, and B, it does not emit light in a specific color.

FIG. 4 illustrates an example in that that the light emitting portions 10 of red color and the light emitting portions 10 of green color are alternately connected along the column direction Y through the connecting portion 20. However, the present embodiment is not limited thereto, and in various embodiments, the light emitting portions 10 of one or more colors are alternately or continuously connected along the column direction Y through the connecting portion 20.

A power line 410 configured to apply a low potential voltage to the pixel areas P may be further disposed in display area DA. The power line 410 may include at least one first pattern 411 extending in the row direction X and at least one second pattern 412 extending in the column direction Y.

The second pattern 412 is disposed overlapping the light emitting portions 10 disposed in a column. In FIG. 4, the second pattern 412 is disposed overlapping the light emitting portions 10 of red color disposed in the first column C1 and the light emitting portions 10 of red color disposed in the seventh column C7, respectively. However, the present embodiment is not limited thereto, and the second patterns 412 may be disposed overlapping the same or different-colored light emitting portions 10. The first pattern 411 is disposed overlapping the connecting portion 20.

The power lines 410 may be connected to an auxiliary electrode 400 in an auxiliary electrode contact portion CT. Also, the auxiliary electrode 400 may be connected to a cathode electrode 230 in the auxiliary electrode contact portion CT. The auxiliary electrode contact portion CT is formed at an intersection of the first pattern 411 and the second pattern 412 of the power line 410. The auxiliary electrode contact portion CT may overlap an intersection of the light emitting portion 10 and the connecting portion 20 and/or the connecting portion 20 traversing between the light emitting portions 10 in the row direction X.

The intersection of the light emitting portion 10 and the connecting portion 20 has a larger surface area than each of the light emitting portion 10 and the connecting portion 20.

Accordingly, the auxiliary electrode contact portion CT may be formed in various shapes over a wider area. When the surface area of the auxiliary electrode contact portion CT increases, the electrical connection between the cathode electrode 230, the auxiliary electrode 400 and the power line 410 becomes more stable. In addition, the resistance of the electrical connection formed in such way is reduced, and thus power consumption may be reduced.

Figure 5:
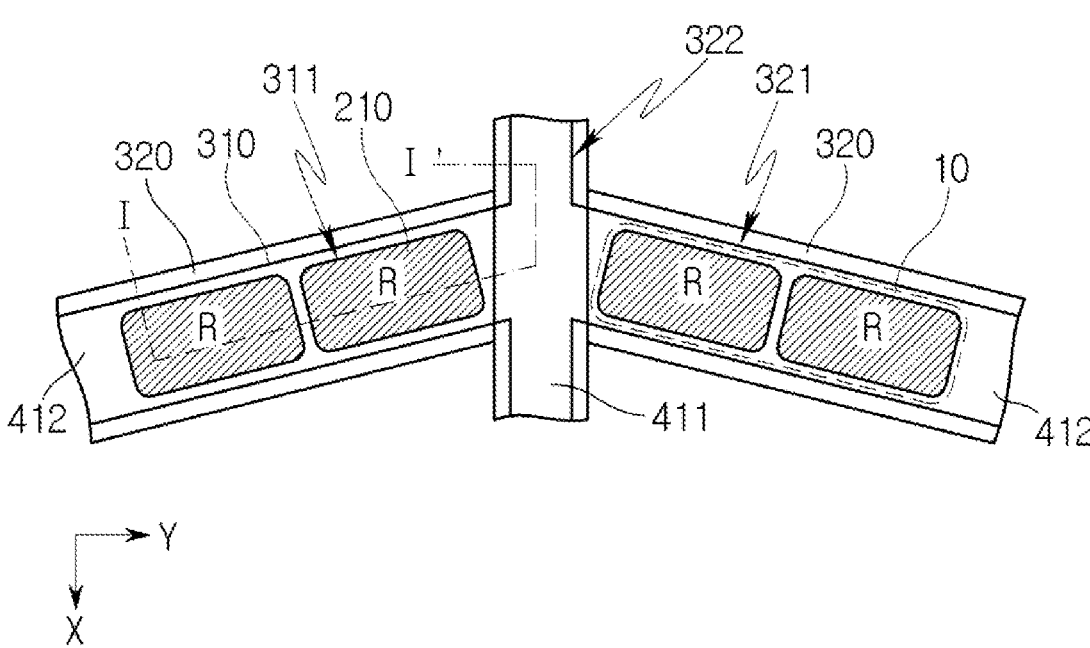
FIG. 5 is a plan view of an enlarged section AA of FIG. 4.
Figure 6:
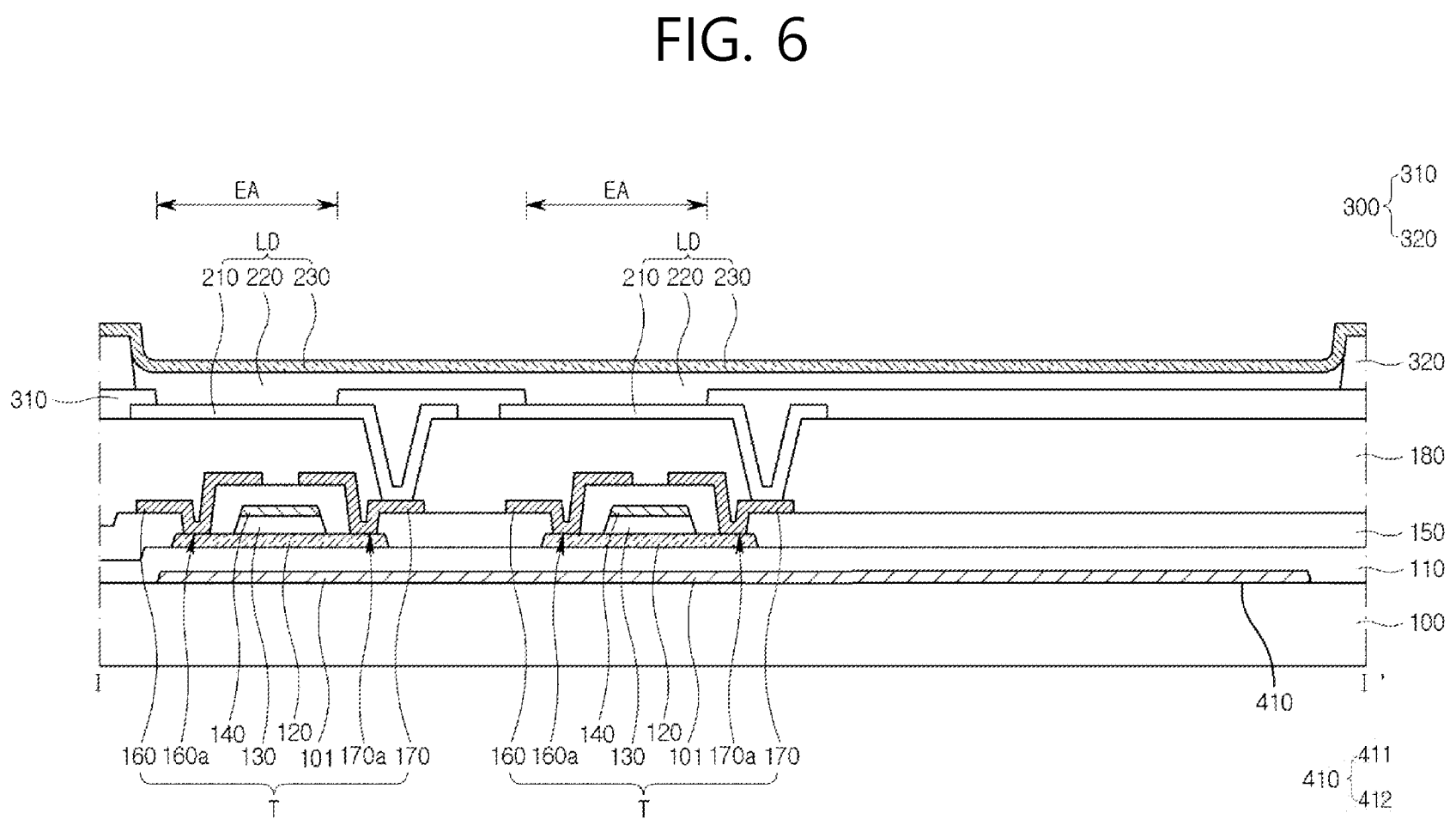

FIG. 5 is a plan view of an enlarged section AA of FIG. 4, and FIG. 6 is a cross-sectional view taken along a line I-I' of FIG. 5.

Referring to FIGS. 5 and 6, the display device 2 includes a substrate 100, a circuit element layer disposed on the substrate 100 and having circuit elements disposed thereon, and a light emitting diode layer disposed on the circuit element layer and having light emitting elements LD of a pixel area pixel area P disposed thereon.

The substrate 100 may be a base substrate and a light-transmissive substrate. The substrate 100 may be a rigid substrate including glass or tempered glass or a flexible substrate made of a plastic material.

In an embodiment, a buffer layer (not shown) may be formed on the substrate 100. The buffer layer may prevent diffusion of ions or impurities from the substrate 100 and may block moisture penetration.

A light shielding layer 101 may be formed on the substrate 100. The light shielding layer 101 may be disposed overlapping a gate electrode 140 of a transistor T, which will be described below, so as to block external light. The power line 410 may be further formed on the substrate 100. In some embodiments, the power line 410 may also function as and be the light shielding layer 101 so that a separate layer is not needed for each.

The buffer layer 110 may cover the light shielding layer 101 and the power line 410. Such buffer layer 110 may prevent diffusion of ions or impurities from the substrate 100 and may block moisture penetration.

An active pattern 120 may be formed on the buffer layer 110. The active pattern 120 may be made of a silicon-based semiconductor material or an oxide-based semiconductor material.

A gate insulation layer 130 may be formed on the active pattern 120, and a gate electrode 140 may be formed on the gate insulation layer 130. An inter-layer insulation layer 150 may be formed on the gate electrode 140, and a source electrode 160 and a drain electrode 170 may be formed on the inter-layer insulation layer 150. The source electrode 160 and the drain electrode 170 may be connected to the active pattern 120 through contact holes penetrating the inter-layer insulation layer 150 and the gate insulation layer 130. The source electrode 160, the drain electrode 170, the gate electrode 140 and the active pattern 120 corresponding thereto may constitute the transistor T.

An overcoating layer 180 may be formed on the source electrode 160 and the drain electrode 170. The overcoating layer 180 may be a planarization film for alleviating a step difference in the lower structure.

A light emitting diode layer is formed on the overcoating layer 180 and includes light emitting elements LD. The light emitting diode LD includes an anode electrode 210, a light emitting layer 220, and a cathode electrode 230.

The anode electrode 210 is formed on the overcoating layer 180. The anode electrode 210 is connected to the drain electrode 170 of the transistor T through a via hole penetrating the overcoating layer 180.

A bank 300 is further formed on the overcoating layer 180. The bank 300 is formed to cover an edge of the anode electrode 210. The bank 300 may include a first bank 310 having a hydrophilic property and a second bank 320 having a hydrophobic property. In an embodiment, the first bank 310 may be formed to have a less thickness and a wider width than the second bank 320. When a light emitting layer 220 is formed by the first bank 310 having a hydrophilic property via a solution process, which will be described below, the solution for forming the light emitting layer 220 may be spread easily.

The bank 300 may be disposed to define the light emitting portions 10. In detail, the first bank 310, which is a hydrophilic bank, may be a defining layer that separates the pixel areas R, G, and B from each other. That is, the first bank 310 is formed to have a first opening 311 covering the edge of the anode electrodes 210 of each pixel area (RIG/B) and exposing the central area thereof. In an embodiment, the first bank 310 may have a lattice structure extending in the row direction X and the column direction Y.

The second bank 320, which is a hydrophobic bank, may be a defining layer that separates each light emitting portion 10 from each other. That is, the second bank 320 may include second openings 321 surrounding each light emitting portion 10 and third openings 322 surrounding each connecting portion 20.

In an embodiment, the second opening 321 may have a quadrangular shape inclined to a right or left side with respect to the column direction Y as illustrated, but the present embodiment is not limited thereto. In addition, the second openings 321 are illustrated in FIG. 5 as having the same shape and surface area, but not limited thereto, and at least one of the second openings 321 may have a shape and/or surface area different from that of another second opening 321.

The third opening 322 has a shape that substantially extends in the row direction X between two adjacent pixel rows. At least a portion of the second openings 321 disposed in the two adjacent pixel rows may be connected to each other through the third opening 322 as illustrated in FIG. 5. The second openings 321 in the inclined shape with respect to the column direction Y and one third opening 322 connecting them while extending in the row direction X form one fishbone shape. The connection form between the second opening 321 and the third opening 322 depends on the relationship between the light emitting portion 10 defined by the second opening 321 and the connecting portion 20 defined by the third opening 322.

The second bank 320 may be formed to have a narrower width than the first bank 310. Since one light emitting portion 10 includes one or more pixel areas R, G, and B, the second bank 320 may expose one or more first openings 311 through the second opening 321. In this case, between the adjacent first openings 311, one area of the first bank 310 may be exposed without being covered by the second bank 320. A gate insulation layer 130, an inter-layer insulation layer 150 and an overcoating layer 180 on the substrate 100 are formed to cover the power line 410.

The light emitting layer 220 is formed on the anode electrode 210. The light emitting layer 220 is formed on an exposed and not covered area of the anode electrode 210 by the bank 300.

The cathode electrode 230 is widely deposited on the substrate 100. The cathode electrode 230 is formed on the light emitting layer 220 and the bank 300. That is, the cathode electrode 230 may be formed to cover the light emitting layer 220 and the bank 300.

13

14

Figure 7:
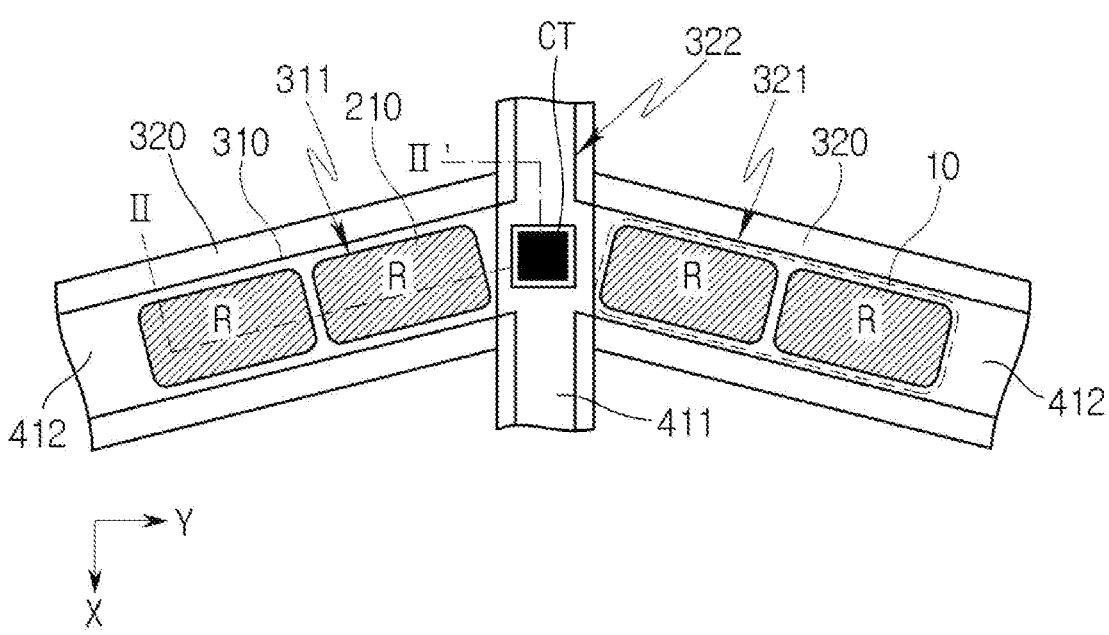
FIG. 7 is a plan view of an enlarged section BB of FIG. 4.
Figure 8:
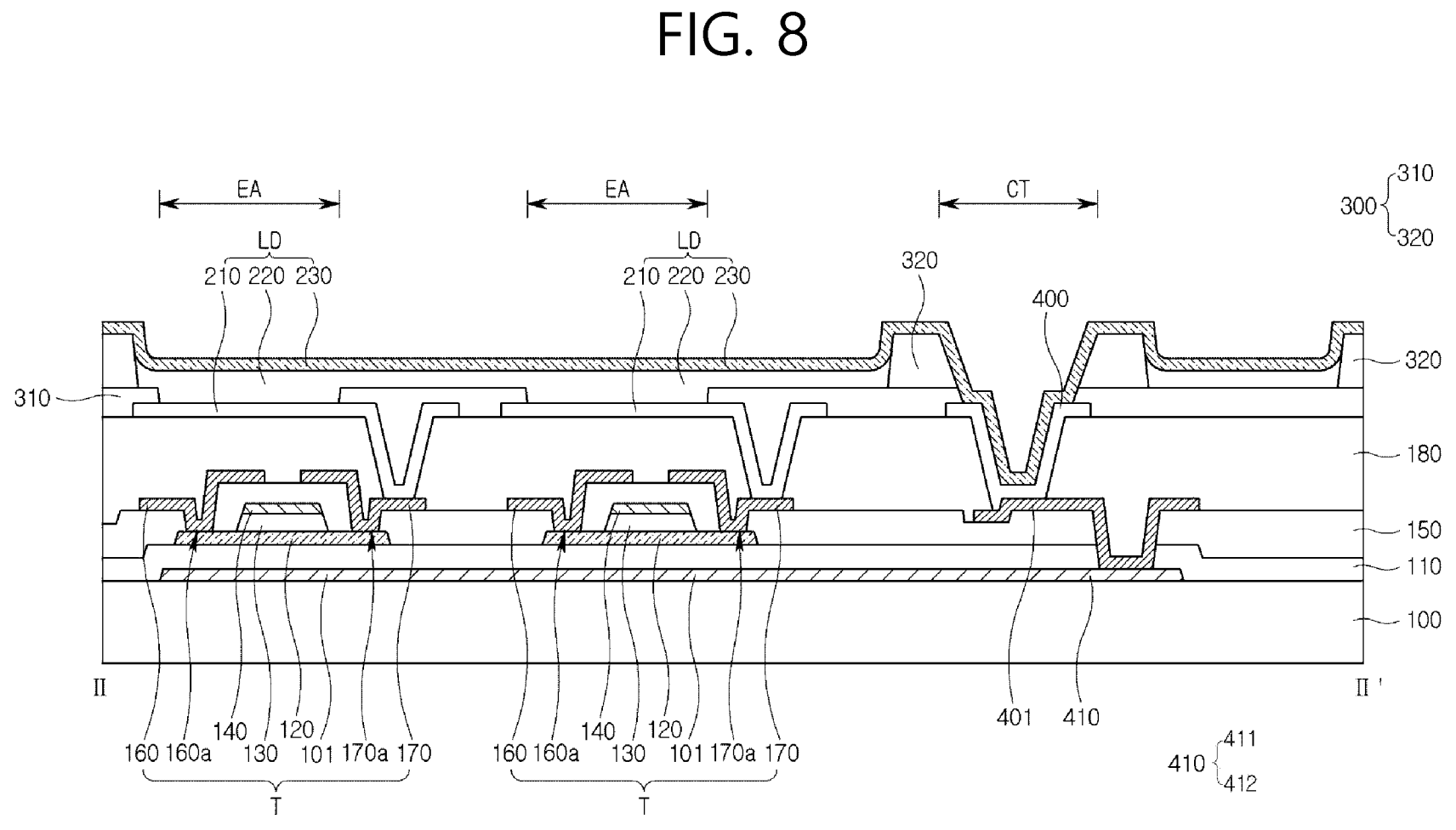

FIG. 7 is a plan view of an enlarged section BB of FIG. 4, and FIG. 8 is a cross-sectional view taken along a line II-II' of FIG. 7.

Referring to FIGS. 7 and 8, the display device 2 includes the power line 410 configured to apply a low potential voltage to the pixel areas P. The power line 410 may include at least one first pattern 411 extending in the row direction X and at least one second pattern 412 extending in the column direction Y.

The second pattern 412 overlaps the light emitting portions 10 disposed along the column direction Y while extending in the column direction Y. The first pattern 411 is disposed overlapping the connecting portion 20. The patterns 411 and 412 can also function as the light shield layer 101 in some locations and some embodiments. In those locations in which pattern 411 and 412 are present, a separate light shield layer is not needed since these two patterns also perform the function of the light shield layer 101.

The power lines 410 may be connected to the auxiliary electrode 400 at the auxiliary electrode contact portion CT. Also, the auxiliary electrode 400 may be connected to the cathode electrode 230 at the auxiliary electrode contact portion CT.

The auxiliary electrode contact portion CT is formed at an intersection of the first pattern PL1 and the second pattern PL2 of the power line 410. This auxiliary electrode contact portion CT may overlap the intersection of the light emitting portion 10 and the connecting portion 20 and/or the connecting portion 20 traversing between the light emitting portions 10 in the row direction X.

The intersection of the light emitting portion 10 and the connecting portion 20 has a larger surface area than each of the light emitting portion 10 and the connecting portion 20. Accordingly, the auxiliary electrode contact portion CT may be formed in various shapes over a wider area. When the surface area of the auxiliary electrode contact portion CT increases, the electrical connection between the cathode electrode 230, the auxiliary electrode 400 and the power line 410 becomes more stable. In addition, the resistance of the electrical connection formed in such way is reduced, and thus power consumption may be reduced.

The light emitting diode layer may further include an auxiliary electrode 400. The bank 300 is further formed to cover an edge of the auxiliary electrode 400 and to expose a central portion thereof. The exposed auxiliary electrode 400 that is not covered by the bank 300 may form an auxiliary electrode contact portion CT. The cathode electrode 230 may contact the auxiliary electrode 400 at the auxiliary electrode contact portion CT by covering the exposed auxiliary electrode 400.

The auxiliary electrode 400 may be connected to the power line 410 through a contact hole formed in the auxiliary electrode contact portion CT. The power line 410 may receive a low potential voltage VSS. The cathode electrode 230 may receive the low potential voltage VSS through the auxiliary electrode 400.

The display device according to embodiments of the present disclosure may prevent or reduce a stain of a light emitting layer formed via a solution process and have an improved surface flatness, thereby the luminous efficiency of an organic light emitting diode can be improved.

It would be understood by those of ordinary skill in the art that the technical configuration of the present disclosure may be implemented in other detailed forms without changing the technical spirit or the essential features of the present disclosure. Thus, it should be noted that the above-described embodiments are provided as examples and should not be interpreted as limiting. Furthermore, the meanings and scope of the claims and all changes or modified forms derived from their equivalents should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
    a substrate having a display area in which pixel areas are disposed and a non-display area adjacent to the display area;
    light emitting portions disposed in the pixel areas, the pixel areas being aligned in rows and columns, each of the light emitting portions configured to emit light, each light emitting portion having a width and a length, the length being greater than the width;
    a bank defining the light emitting portions; and
    a light emitting layer formed on the light emitting portions,
    wherein the light emitting portions are inclined alternatively to a left side or a right side, along the length of the light emitting portion, with respect to a column direction, and
    wherein each light emitting portion has two light emitting diodes of a same color and the two light emitting diodes of the same color are inclined to a same left side or right side.

2. The display of claim 1 further including: connecting portions connecting the light emitting portions;
    wherein the connecting portions extend substantially in a row direction between rows of two adjacent light emitting portions.

3. The display device of claim 1,
    wherein same-colored light emitting portions are disposed along the column direction, and
    wherein the connecting portions connect the same-colored light emitting portions disposed adjacently in the row direction.

4. The display device of claim 1, wherein one connecting portion and the light emitting portions connected to the one connecting portion form a fishbone shape.

5. The display device of claim 1, wherein connecting portions connected to respective different-colored light emitting portions are disposed alternately along the column direction.

6. The display device of claim 1, further comprising:
    a power line configured to apply a low potential voltage to the pixel areas,
    wherein the power line comprises:

first patterns extending along the column direction while overlapping the light emitting portions disposed along the column direction; and second patterns disposed overlapping the connecting portions.

7. The display device of claim 6, further comprising:

light emitting elements disposed in each of the pixel areas and connected to the power line through a contact hole formed in an auxiliary electrode contact portion, wherein the auxiliary electrode contact portion is disposed at an intersection of the first patterns and the second patterns of the power line.

8. The display device of claim 1, further comprising:

a first dummy connecting portion extending in the non-display area along the column direction and connecting same-colored connecting portions; and a second dummy connecting portion extending in the non-display area along the row direction and connecting same-colored light emitting portions disposed at an edge of the display area.

9. The display device of claim 8, wherein the first dummy connecting portion and the second dummy connecting portion are connected to each other at one end.

10. The display device of claim 8, wherein the light emitting portion is formed to extend from the connecting portion to the first dummy connecting portion and the second dummy connecting portion.

11. The display device of claim 1, wherein the bank comprises:

a first bank defining the pixel areas and having a hydrophilic property; and a second bank of a hydrophobic property disposed on the first bank and defining the light emitting portions and the connecting portions.

12. A display device, comprising:

a substrate having a display area in which pixel areas are disposed and a non-display area adjacent to the display area;

a bank defining the boundaries of light emitting diode areas of the pixel areas; and a light emitting diode formed in each of the light emitting diode areas, wherein the bank comprises:

a first bank having first openings exposing a central portion of an anode electrode of the light emitting diode; and a second bank formed on the first bank and having a plurality of second openings exposing light emitting portions that each includes at least one of the pixel areas, the second bank also having a plurality of third openings connecting the light emitting portions, wherein the second openings have a quadrangular shape inclined to a left or right side with respect to a column direction, and wherein the third openings extend substantially in a row direction between the second openings adjacent to each other in a column direction.

13. The display device of claim 12, wherein a structure comprised of one of the plurality of third openings and a first set of the plurality of second openings connected to the one of the plurality of third openings form a fishbone shape.

14. The display device of claim 12, further comprising:

a power line configured to apply a low potential voltage to the pixel areas, wherein the power line comprises:

first patterns extending along the column direction while overlapping the second openings disposed along the column direction; and second patterns disposed overlapping the plurality of third openings.

15. The display device of claim 14, wherein a cathode electrode of the light emitting diode is connected to the power line through a contact hole formed in an auxiliary electrode contact portion, and wherein the auxiliary electrode contact portion is disposed at an intersection of the first patterns and the second patterns of the power line.

16. A display device, comprising:

a substrate having a display area in which a pixel area is disposed and a non-display area adjacent to the display area;

a plurality of light emitting diodes formed within the pixel area;

a first connecting portion that extends in a row direction, the first connecting portion having a first plurality of light emitting portions extending therefrom at an acute angle relative to the first connecting portion, each light emitting portion of the first plurality of light emitting portions including a first light emitting diode of the plurality of light emitting diodes;

a first bank with a first opening exposing a central portion of an anode electrode of the first light emitting diode; and a second bank disposed above the first bank with a second opening exposing the first light emitting diode, wherein the second opening overlaps two first openings that are inclined to a same left side or right side.

17. The display device of claim 16, wherein the light emitting portions of the first plurality extend from a first side and second side of the first connecting portion to form a fishbone pattern comprised of the first connecting portion and the first plurality of light emitting portions that extend from the first connecting portion.

18. The display device of claim 16, further including:

a second plurality light emitting portions that extend along a column direction as a single column and the inclination of each of the light emitting portions of the second plurality alternates from towards the right side and towards the left side along the single column.

19. The display device of claim 16, wherein each of the first plurality of light emitting portions extending from the connecting portion emits light of a same color and each light emitting portion in a column line emits light of a same color.

20. The display device of claim 17, further including:

a second connecting portion, a third connecting portion and a fourth connecting portion each having a respective plurality of light emitting portions extending therefrom in a fishbone pattern, the light emitting portions of first and third connecting portions emitting the same color as each other and the light emitting portions of the second and fourth connecting portions emitting the same color light as each other.

21. The display device of claim 16, further including:

a third plurality of light emitting portions positioned alternating in between the first plurality of light emitting portions along the first connecting portion, the third plurality of light emitting portions being physically spaced from the first connecting portion and the first plurality of light emitting portions.

* * * * *